(12) United States Patent
Kato et al.

(10) Patent No.: US 6,319,649 B1
(45) Date of Patent: Nov. 20, 2001

(54) PHOTOSENSITIVE RESIN COMPOSITION AND METHOD OF FORMING RESIST IMAGES

(75) Inventors: Koji Kato, Hitachi; Masahiro Hashimoto, Kita-Ibaragi; Michiaki Hashimoto, Tsukuba; Toshio Sakamizu, Sagamihara; Hiroshi Shiraishi, Hachiouji, all of (JP)

(73) Assignees: Hitachi, Ltd.; Hitachi Chemical Co., Ltd., both of Tokyo (JP)

( * ) Notice: Subject to any disclaimer, the term of this patent is extended or adjusted under 35 U.S.C. 154(b) by 0 days.

(21) Appl. No.: 09/024,873

(22) Filed: Feb. 17, 1998

Related U.S. Application Data

(63) Continuation of application No. 08/819,367, filed on Mar. 17, 1997, which is a continuation of application No. 08/536,641, filed on Sep. 29, 1995.

(30) Foreign Application Priority Data

Oct. 13, 1994 (JP) .................................................. 6-247656

(51) Int. Cl.$^7$ ............................. G03F 7/021; G03F 7/039; G03F 7/30
(52) U.S. Cl. ...................... 430/176; 430/270.1; 430/326; 430/905; 430/910
(58) Field of Search .............................. 430/270.1, 905, 430/910, 176, 326

(56) References Cited

U.S. PATENT DOCUMENTS

| | | | |
|---|---|---|---|
| 3,779,778 | 12/1973 | Smith et al. | 96/115 |
| 5,393,642 | 2/1995 | DuBois et al. | 430/271 |
| 5,403,695 | 4/1995 | Hayase et al. | 430/192 |
| 5,759,739 | * 6/1998 | Takemura et al. | 430/270.1 |
| 5,837,419 | * 11/1998 | Ushirogouchi et al. | 430/270.1 |
| 5,879,856 | * 3/1999 | Thackeray et al. | 430/270.1 |

FOREIGN PATENT DOCUMENTS

| | | |
|---|---|---|
| 5945439 | 3/1984 | (JP) . |
| 225850 | 1/1990 | (JP) . |

* cited by examiner

Primary Examiner—John S. Chu
(74) Attorney, Agent, or Firm—Antonelli, Terry, Stout & Kraus, LLP

(57) ABSTRACT

A chemically amplified photosensitive resin composition containing a first compound forming an acid by irradiation of actinic ray and a second compound that changes the solubility to an aqueous alkali solution with acid-catalyzed reaction wherein an ion dissociative compound having the composition represented by the general formula (1) or (2), as well a method of forming a resist pattern using the composition are disclosed, the formulae being expressed by:

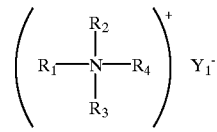

(1)

where each of $R_2$, $R_3$ and $R_4$ represents hydrogen, and an alkyl or aryl group of 1 to 7 carbon atoms, at least one of $R_1$, $R_2$, $R_3$ and $R_4$ represents hydrogen, $Y_1$ represents chlorine, bromine, iodine, carbonate group of 1 to 7 carbon atoms or sulfonate group of 1 to 7 carbon atoms, and

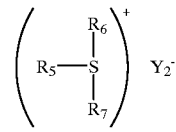

(2)

20 Claims, No Drawings

PHOTOSENSITIVE RESIN COMPOSITION AND METHOD OF FORMING RESIST IMAGES

SPECIFICATION

This application is a Continuation application of application Ser. No. 08/819,367, filed Mar. 17, 1997, which is a Continuation application of application Ser. No. 08/536,641, filed Sep. 29, 1995, the contents of each of which are incorporated herein by reference in their entirety.

BACKGROUND OF THE INVENTION

The present invention concerns a photosensitive resin composition and a method of forming a resist pattern and, more in particular, it relates to a photosensitive resin composition suitable for formation of an extremely small pattern, for example, in the manufacture of a semiconductor device, and a method of forming a resist pattern using such a photosensitive composition.

That is, the present invention concerns a photosensitive resin composition and method of forming resist image by irradiating ultraviolet light, deep ultraviolet light, X-ray and electron beam (hereinafter collectively referred to as actinic ray in the present specification), thereby forming an acid in an irradiated portion (latent images) and changing the solubility of the irradiated portion to an alkaline developer by an acid-catalyzed reaction to form a predetermined pattern, as well as a method of forming a resist pattern using the photosensitive composition.

In recent years, the requirement of small pattern with successive generation of VLSI circuits has been remarkably progressed. For example, it is required to form a pattern of less than sub-half micronmeter, like in 64 M, and 256 M.DRAM and a photosensitive composition of excellent resolution capability has been demanded.

For preparing a semiconductor integrated circuit, a reduction projecting aligner (stepper) has been used and a pattern of a size smaller than the wavelength of a light used for exposure can be resolved, by improvement in-an exposure tool or resist. However, it has not yet been obtained such a high resolution capability as capable of forming, for example, of 64 M and 256 M.DRAM device.

On the other hand, an exposure method using X-ray or electron-beam can be expected as an exposure method capable of forming a further smaller pattern than the exposure method using light and, in this case, the minimum size of the pattern formed depends on a beam diameter of X-ray or electron beam and high resolution capability can be obtained.

However, throughput in the wafer processing is important for mass production of LSI irrespective of the exposure method used and it is difficult to put a method to practical use if the productivity is low even if it can form a small pattern. For improving the productivity in the wafer processing, it is extremely important not only for the improvement of a projecting exposure device but also for making the sensitivity higher of a resist (photo-sensitive composition) to be used.

As a resist material for attaining an increased sensitivity, chemically amplified photosensitive resin compositions containing a compound showing high reactivity under the presence of an acid catalyst and an acid precursor forming an acid under the irradiation of actinic ray have been disclosed, for example, in U.S. Pat. No. 3,779,778, Japanese Patent Laid-Open No. Sho 59-45439 and Japanese Patent Laid-Open Hei 2-25850. According to the descriptions of the prior art, a compound or polymer having acetal groups, or a compound or polymer having t-butyl groups has been used as a highly reactive medium. The above-mentioned compound contains an acid decomposing group and is denatured into a compound or polymer that changes the solubility to a liquid developer, by the capability of reaction of an acid generated by the irradiation of actinic ray.

However, since the existent resist material described above has a small difference in the dissolving speed to a developer between an irradiated area and a non-irradiated area, it brings about a problem of lowering a so-called γ value (lowering of resolution capability), which is a significant bar upon forming a small pattern at a high accuracy. Further, when an ingredient reacting under the presence of an acid catalyst and an alkali soluble resin are used in admixture, it results in a serious problem of separation into two inhomogeneous layers, or forming an insoluble surface inhibition layer by microphase separation of insoluble surface inhibition layer, thereby deteriorating the shape of a pattern. Further, the chemically amplified resist material also involves a problem in the stability upon treatment such as shelf life (storable period) or stability in processing.

As described above, it has been difficult in the prior art to compatibly provide high sensitivity, high resolution ability and high stability altogether.

SUMMARY OF THE INVENTION

An object of the present invention is to overcome the foregoing problems in the prior art and provide a photosensitive resin composition capable of forming a positive or negative type pattern having high sensitivity, high resolution degree and high stability, exactly at a high accuracy, as well as a method of forming resist pattern using the composition.

Another object of the present invention is to provide a photosensitive resin composition capable of forming a positive or negative type small pattern having a sufficiently high γ value by development at a high accuracy using an industrially advantageous aqueous alkali solution as a liquid developer and a method of forming the resist pattern using the composition.

A further object of the present invention is to provide a chemically amplified photosensitive resin composition which is excellent in the shelf life or the stability in the processing, and free from the worry of causing troubles during development, as well as a method of forming resist pattern using the composition.

For attaining the foregoing object, a photosensitive resin composition in accordance with the present invention is based on a novel finding that the foregoing subject can be solved by adding a specified compound having a ion dissociating property to a photosensitive resin composition, and it comprises a chemically modified photosensitive resin composition containing a first compound forming an acid by irradiation of actinic ray and a second compound that changes solubility to an aqueous alkali solution with acid-catalyzed reaction, wherein a compound having a composition represented by the following general formula (1) or general formula (2) is incorporated as the ion dissociative compound, the formulae being expressed by:

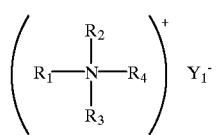

(1)

where each of $R_1$, $R_2$, $R_3$ and $R_4$ represents hydrogen, and an alkyl group of 1 to 7 carbon atoms or an aryl group, at least one of $R_1$, $R_2$, $R_3$ and $R_4$ represents hydrogen, $Y_1$ represents chlorine, bromine, iodine, carbonate group of 1 to 7 carbon atoms or sulfonate group of 1 to 7 carbon atoms, and

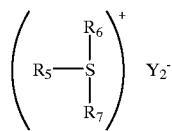

(2)

where each of $R_5$, $R_6$ and $R_7$ represents hydrogen, and an alkyl of 1 to 7 carbon atoms or an aryl group, $Y_2$ represents chlorine, bromine, iodine,or a carbonate group of 1 to 7 carbon atoms.

As the ion dissociative compound represented by the general formula (1), there can be used the ammonium salts such as tripentyl ammonium chloride, ammonium acetate, ammonium benzoate and triphenyl ammonium chloride. Further, as the ion dissociative compound represented by the general formula (2), there can be used the sulfonium, for example, salts such as trimethyl sulfonium iodide, triphenyl sulfonium bromide and ethyl dimethyl sulfonium iodide.

The ion dissociative compound functions as a stabilizer and a generator that forms acid by the irradiation of actinic ray, and a contrast enhancement material for improving the resolution capability of the resist in the photosensitive resin composition and the resist film. That is, in the chemically amplified resist material it is important to control the extent of the acid generation by the first compound upon the irradiation of the actinic ray and diffusion of the acid generated by the compound to stabilize the photosensitive resin composition and the resist film. In the present invention, since the first compound that generates the acid by the irradiation of the actinic ray and the acid generated by the compound are buffered in the photosensitive resin composition and the resist film by the ion dissociative compound shown in the general formulae (1) and (2), the control is facilitated and the stability is remarkably improved. Further, since it is difficult to control the yield of the acid generated by the irradiation of the actinic rays, accurate determination for the blending amount of the first compound that generates the acid upon the irradiation of the actinic ray is difficult, which lowers the contrast of the resist and deteriorate the resolution. In the present invention, however, since the control for the amount of the acid generated by the first compound the irradiation of the actinic ray is facilitated by the addition of the ion dissociative compound, lowering of the resolution in the resist film can be prevented effectively.

The addition amount of the ion dissociative compound is preferably from 0.01 to 10 wt % based on 100 wt % of the first compound that generates the acid by the irradiation of the actinic ray. If the addition amount is from 0.01 to 10 wt %, the stability and the resolution degree can be controlled easily to provide a sufficient effect as the stabilizer and the contrast enhancement material. If the addition amount of the ion dissociative compound is more than 10 wt %, the yield of the acid generated by the first compound forming the acid by the irradiation of the actinic ray is lowered to lower the sensitivity. On the other hand, if it is less than 0.01 wt %, the stability tends to be deteriorated.

Further, the ion dissociative compound may be added singly or a plural kinds of them may be added.

As the first compound that generates the acid by the irradiation of the actinic ray in the present invention, there can be used, for example, various kinds of onium salts such as diazonium salts, diaryl iodonium salts and onium salts such as tri-aryl sulfonium salt. As the counter anion for the onium salts, there can be used, for example, tetrafluoroboric acid, hexafluoroantimonic acid, trifluoro methane sulfonic acid, trifluoro acetic acid and toluenesulfonic acid. An ester of a compound containing phenolic polyhydroxyl groups and alkyl sulfonic acids may also be used.

Further, the addition amount of the first compound that generates the acid by the irradiation of the actinic ray is preferably from 5 to 30 wt % based on 100 wt % of the second compound that changes solubility to the aqueous alkali solution with the acid-catalyzed reaction. If the addition amount is from 5 to 30 wt %, a sufficient sensitivity to the actinic ray can be obtained. If the addition amount of the first compound that generates the acid by the irradiation of the actinic ray is more than 30 wt %, the solubility to a resist solvent is lowered. On the other hand, if it is less than 5 wt %, the sensitivity tends to be lowered.

As the second compound that changes solubility to the aqueous alkali solution with the acid-catalyzed reaction, there can be mentioned a compound that increases or decreases solubility to the aqueous alkali solution with the acid-catalyzed reaction. As the reaction mechanism of increasing the solubility to the aqueous alkali solution, there may be considered, for example, such a mechanism that the solubility to the aqueous alkali solution is promoted by hydrolysis due to the acid-catalyzed reaction, or a mechanism in which a solution inhibiting property to the aqueous alkali solution present previously in the second reactive compound is lost due to depolymerization caused by the acid-catalyzed reaction.

As the second reactive compound hydrolyzed by the acid-catalyzed reaction, there can be used, for example, a polymer formed by reacting, for example, a tetrahydropyranyl group, t-butoxyl group, silyl group or ethoxyethyl group to a hydroxy group of an alkali soluble phenol resin, such as a polyvinyl phenol. As an example of the second reactive compound causing depolymerization by the acid-catalyzed reaction, there can be used a mixed system of a high molecular compound having an acetal or carbonate structure in a main chain, for example, polyphthalic acid or polycarbonate and an alkali soluble resin such as a novolac resin. As the reaction mechanism in which the solubility to the aqueous alkali solution is lowered, there may be considered a mechanism in which the solubility to the aqueous alkali solution is lowered by polymerizing or condensing reaction with the acid-catalyzed reaction in the second compound. For example, in a system comprising an alkali soluble resin such as a novolac resin and a compound having, for example, epoxy, methoxyethyl, methylol group, crosslinking reaction of the second reactive compound itself is caused by the polymerizing or condensing reaction by the acid, to decrease the solubility to the aqueous alkali solution.

In the present invention, since the alkali solubility of the highly reactive second compound is controlled, an alkali soluble resin can be used as required. As the alkali soluble resin, there can be used, for example, a novolac resin, an acrylic resin, a copolymer of styrene and acrylic acid, a polymer of hydroxystyrene and polyvinyl phenol.

As the alkali soluble resin used in the present invention, a novolac resin obtained by polycondensing phenols having one or more phenolic hydroxyl groups with aldehydes is suitable. There can be used, for example, phenols having one or more phenolic hydroxyl groups such as phenyl, o-cresol, m-cresol, p-cresol, 2,3-xylenol, 2,4-xylenol, 2,5-xylenol, 3,4-xylenol, 3,5-xylenol or 2,3,5-trimethylphenol, phenols having two phenolic hydroxyl groups such as resorcinol and cathecol, and phenols having three phenolic hydroxyl groups such as phloroglucinal, pyrogallol and hydroxy hydroquinone. The phenols may be used singly or two or more of them may be used together.

As the aldehydes, there can be used, for example, formaldehyde and paraformaldehyde. The amount of the aldehydes used is preferably within a range from 0.05 to 1.5 mol based on one mol of the phenols.

Further, as the catalyst for polycondensation, an acid catalyst is preferred. As such an acid catalyst, inorganic acid such as hydrochloric acid, nitric acid or sulfuric acid and an organic acid such as formic acid, oxalic acid or acetic acid can be used. The amount of the acid catalyst used is preferably within a range from $1 \times 10^{-5}$ to $1 \times 10^{-1}$ mol based on one mol of the phenols. The reaction temperature and the reaction time for the polycondensation can be adjusted properly in accordance with the reactivity of the starting materials for synthesis. Usually, the reaction temperature is from 70 to 135° C., and the reaction time is from 1 to 12 hours. As the method for the polycondensation, there can be used, for example, a method of mixing the phenols, aldehydes and catalyst collectively and reacting them, or a method of adding the phenols and aldehydes along with the progress of the reaction under the presence of the catalyst.

After the completion of the polycondensing reaction, the temperature in the reaction system is elevated to 150–200° C. under a reduced pressure, for example, 20–50 mmHg for removing unreacted starting materials, condensation water and catalyst present in the reaction system, and the resin is recovered subsequently.

The photosensitive resin composition according to the present invention can be blended with a surface active agent, for example, for preventing striation (unevenness in film thickness), for improving the coating performance or developability. Further, the photosensitive resin composition according to the present invention can optionally be blended with a dissolution inhibitor or the like for improving the shelf life.

In the present invention, the photosensitive resin composition described above is prepared into a solution, which is coated on a substrate for forming a semiconductor to form a resist film and the resist film is irradiated with actinic ray and developed to form resist patterns. There are no particular restrictions on the conditions for the irradiation of the actinic ray and the development.

As the solvent used for preparing the photosensitive resin composition as the solution, there can be used, for example, glycol ethers such as ethylene glycol monomethyl ether, ethylene glycol alkyl ether acetates such as methyl cellosolve acetate, diethylene glycols such as diethylene glycol monomethyl ether, propylene glycol alkyl ether acetates such as propylene glycol methyl ether acetate, aromatic hydrocarbons such as toluene, ketones such as cyclohexanone and esters such as 2-hydroxypropionic acid.

As the developer for the resist film, there can be used an aqueous alkali solution having dissolved therein inorganic alkalies such as sodium hydroxide, primary amines such as ethyl amine, secondary amines such as diethyl amine, tertiary amines such as triethyl amine, alcohol amines such as dimethyl ethanol amine, tetramethyl ammonium hydroxide, quaternary ammonium salts such as choline and cyclic amines such as pyperidine.

The ion dissociative compound in the present invention functions as a stabilizer for the compound forming the acid by the irradiation of the actinic ray and a contrast enhancement material for improving the resolution of the resist thereby enabling to obtain a resist material of high sensitivity, high resolution capability and sufficient stability.

DETAILED DESCRIPTION OF THE PREFERRED EMBODIMENTS

At first, a method of synthesizing a resin used in the present invention and a first compound that generates an acid by the irradiation of actinic ray are shown as Synthesis Examples 1–3.

Synthesis Example 1

Materials shown in Table 1 are charged in a separable flask equipped with a stirrer, condenser and a thermometer, the separable flask is immersed in an oil bath and kept at an internal temperature of 97° C., and polycondensation is conducted while stirring for three hours.

Subsequently, the internal temperature is raised to 180° C. and, at the same time, the pressure in the separable flask is reduced to 10–20 mmHg, to remove unreacted phenols, formaldehyde, water and oxalic acid. Then, the molten resin is poured into a metal bat to recover cresol novolac resin.

The resin is hereinafter referred as resin I.

TABLE 1

| Material | Addition amount (g) |
| --- | --- |
| m-cresol | 328.1 |
| p-cresol | 400.9 |
| 37 wt % formalin | 361.2 |
| Oxalic acid | 2.2 |

Synthesis Example 2

Twenty grams of poly(p-vinyl phenol) (trade name: LINKER M, manufactured by Maruzen Sekiyu Co.) and 300 ml of ethyl acetate are charged in a separable flask equipped with a stirrer and dissolved under stirring at a room temperature (25° C.). Then, 105 g of 3,4-dihydro2H-pyran and 0.5 ml of 12N hydrochloric acid are added, stirred at a room temperature for one hour and then left to stand at a room temperature. Then, 160 ml of an aqueous 2.38 wt % solution of tetramethyl ammonium hydroxide is added and stirred thoroughly and then an organic layer is taken out.

After washing the obtained solution of the organic layer three times each time with 300 ml of distilled water, the organic layer is dried and condensed by an evaporator. 500 ml of petroleum ether is added to 50 ml of the condensed solution to conduct reprecipitation. After repeating the reprecipitation twice, reaction products are dried in a vacuum drier (3 mmHg, 40° C.) for 8 hours to obtain 22 g of poly(p-vinylphenyl) in which tetrahydropyranyl groups are reacted with hydroxyl groups.

Synthesis Example 3

25 g of silver trifluoromethane sulfonate is added to 200 ml of tetrahydrofuran, to which 20 g of trimethyl sulfonium iodide is added and stirred. After reacting them at a room temperature for about one day, precipitated silver iodide is separated by filtration. When the liquid filtrate is condensed and thus obtained crude products are recrystallized by using ethanol, 17 g of trimethylsulfoniomethane sulfonate, is obtained.

EXAMPLE 1

After dissolving 92 wt % of the resin I obtained in Synthesis Example 1, 8 wt % of poly(p-vinylphenol) protected by ultrahydropyral groups obtained in Synthesis Example 2, 5 wt % of trimethylsulfoniotrifluoromethane sulfonate obtained in Synthesis Example 3 as a compound that generates the acid by irradiation of actinic ray and 0.1 wt % of trimethyl sulfonium iodide as an ion dissociative compound into 300 wt % of methyl cellosolve acetate, they are filtered by using a membrane filter of 0.1 $\mu$m pore size, to prepare a resist solution.

The obtained resist solution is coated on a silicon wafer and subjected to a heat treatment at 120° C. for 10 min to obtain a resist film of 1.0 $\mu$m thickness. After exposure of the hole pattern to the resist film by using an electron-beam lithography system under conditions at an acceleration voltage of 50 kV and with an irradiation dose of 3.5 $\mu$C/cm$^2$, it is heated at 100° C. for 10 min to further increase the solubility of a latent image area formed on the resist film to an aqueous alkali solution.

Then, the resist film is developed for 90 sec by using an aqueous 2.38 wt % solution of tetramethyl ammonium hydroxide as a developer, to form a positive resist pattern. As a result of electron microscopic observation for the cross sectional shape of the thus formed hole pattern of 0.4 $\mu$m diameter, the resist pattern had a rectangular cross sectional shape and is excellent no substantial side etching. Further, decrease in the film thickness after development is less than 0.02 $\mu$m and it is sufficient.

After preparing and then storing the resist material at 25° C. for one month, when the resist pattern is formed in the same manner, sufficient patterns could be formed quite in the same manner as above.

The decrease in the film thickness did not change as 0.02 $\mu$m and it is sufficient.

EXAMPLE 2

A positive type resist is prepared and a resist pattern is formed in the same manner as in Example 1 except for using 0.1 wt % of ammonium acetate instead of trimethyl sulfonium iodide as the ion dissociative compound in Example 1.

When the resist pattern is formed by using a resist just after preparation and a resist prepared and then stored at 25° C. for one month respectively, sufficient resist patterns of rectangular cross sectional shape are formed in both of the cases like that in Example 1. Further, the decrease in the film thickness after development is less than 0.02 $\mu$m and it is sufficient.

EXAMPLE 3

A positive type resist is prepared and a resist pattern is formed in the same manner as in Example 1 except for using a tri-substituted ester of pyrogallol and methane sulfonic acid (trade name: PYROGALLOL TRIMETHYLATE, manufactured by Midori Kagaku Co.) instead of trimethylsulfoniotrifluoro methane sulfonate as a compound forming an acid by irradiation of actinic ray in Example 1.

When the resist pattern is formed by using a resist just after preparation and a resist prepared and then stored at 25° C. for one month respectively, sufficient resist patterns of rectangular cross sectional shape are formed in both of the cases like that in Example 1. Further, the decrease in the film thickness after development is less than 0.02 $\mu$m and it is sufficient.

EXAMPLE 4

A resist solution is prepared by dissolving 100 wt % of the resin I obtained in the Synthesis Example 1, 25 wt % of 1-hydroxy-4-bromo-2-bromoacetyl naphthalene, 15 wt % of amino resin (CYMEL 303, manufactured by Mitsui Cyanamide Co.), and 0.1 wt % of trimethyl sulfonium iodide as an ion dissociative compound into 400 wt % of propylene glycol monomethyl ether acetate, and then filtering the solution by using a membrane filter of 0.1 $\mu$m pore size.

The obtained resist solution is coated on the surface of a silicon wafer and subjected to a heat treatment at 100° C. for 10 min to obtain a resist film of 1.0 $\mu$m thickness. A line and space pattern is formed to the resist film by using an electron-beam lithography system under conditions at an acceleration voltage of 50 kV and with an irradiation dose of 7 $\mu$C/cm$^2$, it is heated at 90° C. for 10 min to further decrease the solubility of a hidden image area formed on the resist film to an aqueous alkali solution.

After being heated, the resist film having the latent images formed thereon is developed for 300 sec by using an aqueous 2.38 wt % solution of tetramethyl ammonium hydroxide as a developer, to obtain negative resist patterns. As a result of electron microscopic observation for the cross sectional shape of 0.4 $\mu$m of line and space pattern thus formed, the resist pattern had a rectangular cross sectional shape and it is excellent. Further, the decrease in the film thickness after development is as less than 0.05 $\mu$m and it is sufficient.

After preparing and then storing the resist at 25° C. for one month, when the resist patterns are formed in the same manner, sufficient patterns can be formed quite in the same manner. The decrease in the film thickness did not changes as 0.05 $\mu$m and it is confirmed that the storability of the resist film is sufficient.

Comparison Example 1

A positive type resist is prepared and a resist pattern is formed by the same treatment as in Example 1 except for not adding the ion dissociative compound in Example 1.

As a result, although the decrease in the film thickness after development is sufficient as 0.02 $\mu$m just after the preparation of the resist, the cross sectional shape of the hole patterns are not rectangular but pot-like configuration, with remarkable side etching being observed.

Further, after storing at 25° C. for one month after preparation, the decrease in the film thickness after development is 0.5 $\mu$m and the stability is poor.

Comparison Example 2

A negative type resist is prepared and resist patterns are formed by the same treatment as in Example 4 except for not adding the ion dissociative compound in Example 4.

As a result, although the decrease in the film thickness is sufficient as 95%, the cross sectional shape of 0.4 $\mu$m of line and space patterns are not rectangular but conversely tapered, with remarkable side etching being observed. Further, after preparation and storing of the resist at 25° C. for one month, 0.4 $\mu$m of line and space pattern could not be resolved and the stability is poor.

As apparent from the foregoing explanation, according to the present invention, it is possible to obtain a photosensitive resin composition forming a positive or negative type resist developed with an alkali solution, which has high sensitivity, high resolution capability and satisfactory stability. When actinic ray (ultraviolet light, deep ultraviolet light, electron beams, X-rays, etc.) is irradiated to the resist film by using the photosensitive resin composition and developed by an aqueous alkali solution, a satisfactory resist pattern having a rectangular cross sectional shape with no substantial side etching can be obtained.

We claim:

1. A chemically amplified photosensitive resin composition containing a first compound that generates an acid by irradiation of an actinic ray and a second compound that changes solubility to an aqueous alkali solution with an acid-catalyzed reaction, wherein at least one of an ion dissociative compound represented by the general formula (1) and an ion dissociative compound represented by the general formula (2) is incorporated, said at least one of an ion dissociative compound being at least one compound controlling the acid generated from the first compound by the irradiation of the actinic ray and diffusion of the acid from irradiated areas of the photosensitive resin composition, and stabilizing the photosensitive resin composition and resist film formed therefrom, said formulae being expressed by:

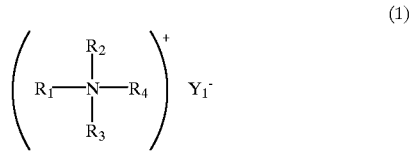

(1)

wherein each of $R_1$, $R_2$, $R_3$ and $R_4$ represents hydrogen, and an alkyl group of 1 to 7 carbon atoms or an aryl group, at least one of $R_1$, $R_2$, $R_3$ and $R_4$ represents hydrogen, and $Y_1$ represents chlorine, bromine, iodine, a carbonate group of 1 to 7 carbon atoms or a sulfonate group of 1 to 7 carbon atoms, and

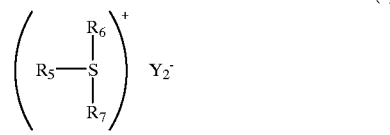

(2)

wherein each of $R_5$, $R_6$ and $R_7$ represents hydrogen, and an alkyl group of 1 to 7 carbon atoms or an aryl group, and $Y_2$ represents chlorine, bromine, iodine, or a carbonate group of 1 to 7 carbon atoms.

2. A photosensitive resin composition as defined in claim 1, wherein said ion dissociative compound represented by the general formula (1) is incorporated.

3. A photosensitive resin composition as defined in claim 1, wherein at least one ion dissociative compound represented by the general formula (1) is incorporated in the composition, said at least one ion dissociative compound represented by the general formula (1) being selected from the group consisting of tripentyl ammonium chloride, ammonium acetate, ammonium benzoate or triphenyl ammonium chloride.

4. A photosensitive resin composition as defined in claim 1, wherein at least one ion dissociative compound represented by the general formula (2) is incorporated in the composition, said at least one ion dissociative compound represented by the general formula (2) being selected from the group consisting of trimethyl sulfonium iodide, triphenylsulfonium bromide and ethyl dimethyl sulfonium iodide.

5. A photosensitive resin composition as defined in claim 1, wherein the content of the ion dissociative compound is from 0.01 to 10 wt % based on 100 wt % of the first compound that generates the acid by the irradiation of actinic ray.

6. A photosensitive resin composition as defined in claim 1, wherein the content of the first compound that generates the acid by the irradiation of actinic ray is from 5 to 30 wt % based on 100 wt % of the second compound that changes the solubility to an aqueous alkali solution with acid-catalyzed reaction.

7. A photosensitive resin composition as defined in claim 1, wherein the first compound forming the acid by the irradiation of actinic ray is an onium salt.

8. A photosensitive resin composition as defined in claim 7, wherein the onium salt is at least one selected from the group consisting of diazonium salt, diaryl iodonium salt and triaryl sulfonium salt.

9. A photosensitive resin composition as defined in claim 7, wherein a counter anion of the onium salt is at least one selected from the group consisting of tetrafluoroboric acid, hexafluoro antimonic acid, trifluoromethane sulfonic acid, trifluoroacetic acid, toluenesulfonate salt and an ester of a compound containing phenolic polyhydroxyl groups and alkyl sulfonic acids.

10. A photosensitive resin composition as defined in claim 1, wherein the second compound is at least one selected from the group consisting of a high molecular compound formed by reacting hydroxyl groups of alkali soluble phenol resin with tetrahydropyranyl group, t-butoxy group, silyl group or ethoxyethyl group, a high molecular compound having an acetal structure in the main chain and a high molecular compound having a carbonate structure in the main chain.

11. A photosensitive resin composition as defined in claim 1, wherein the second compound is a compound having at least one group selected from the group consisting of epoxy group, methoxyethyl group and methylol group, and an alkali soluble resin.

12. A photosensitive resin composition as defined in claim 1, wherein an alkali soluble resin is further contained.

13. A photosensitive resin composition as defined in claim 12, wherein the alkali soluble resin is selected from the group consisting of novolac resin, acrylic resin, copolymer of styrene and acrylic acid, polymer of hydroxy-styrene and polyvinyl phenol.

14. A method of forming a pattern including the following steps:

a step of forming a chemically amplified photosensitive resin composition containing a first compound that generates an acid by irradiation of actinic ray and a second compound that changes the solubility to an aqueous alkali solution with acid-catalyzed reaction, wherein at least one of an ion dissociative compound general formula (1) or an ion dissociative compound general formula (2) is incorporated, said formulae being expressed by:

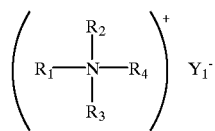

(1)

where each of $R_1$, $R_2$, $R_3$ and $R_4$ represents hydrogen, and an alkyl group of 1 to 7 carbon atoms or an aryl group, at least one of $R_1$, $R_2$, $R_3$ and $R_4$ represents hydrogen, $Y_1$ represents chlorine, bromine, iodine, a carbonate group of 1 to 7 carbon atoms or a sulfonate group of 1 to 7 carbon atoms, and

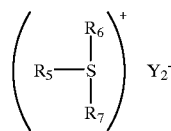

(2)

where each of $R_5$, $R_6$ and $R_7$ represents hydrogen, and an alkyl group of 1 to 7 carbon atoms or an aryl group, $Y_2$ represents chlorine, bromine, iodine, or a carbonate group of 1 to 7 carbon atoms,
- a step of dissolving the photosensitive resin composition in a solvent to form a solution,
- a step of coating the solution on the surface of a substrate, thereby forming a resist film,
- a step of irradiating actinic ray to a predetermined portion of the resist film thereby changing the solubility of the irradiated portion to an aqueous alkali solution, and
- a step of developing the resist film with an aqueous alkali solution to form a predetermined resist pattern.

15. A method of forming a pattern as defined in claim 14, wherein the solvent is selected from the group consisting of glycol ether, ethylene glycol alkyl ether acetate, diethylene glycol, propylene glycol alkyl ether acetate, aromatic hydrocarbon, ketone and ester of 2-hydroxypropionic acid.

16. A method of forming a pattern as defined in claim 14, wherein the aqueous alkali solution is an aqueous solution of a material selected from the group consisting of inorganic alkali, primary amine, secondary amine, tertiary amine, alcohol amine, quaternary ammonium salt and cyclic amines.

17. A method of forming a pattern as defined in claim 14, wherein the actinic rays are selected from the group consisting of ultraviolet light, deep ultraviolet light, X-rays and electron beams.

18. A photosensitive resin composition as defined in claim 1, wherein said composition is capable of being developed by an aqueous alkali solution.

19. A photosensitive resin composition as defined in claim 18, wherein the second compound is a compound that has an increased solubility to the aqueous alkali solution with the acid-catalyzed reaction, whereby said composition is a positive resist composition.

20. A photosensitive resin composition as defined in claim 18, wherein the second compound is a compound that has a decreased solubility to the aqueous alkali solution with the acid-catalyzed reaction, whereby said composition is a negative resist composition.

* * * * *